United States Patent
Sorada

(10) Patent No.: US 8,563,987 B2
(45) Date of Patent: Oct. 22, 2013

(54) SEMICONDUCTOR DEVICE AND METHOD FOR FABRICATING THE DEVICE

(75) Inventor: Haruyuki Sorada, Okayama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/637,217

(22) PCT Filed: Feb. 14, 2012

(86) PCT No.: PCT/JP2012/000968
§ 371 (c)(1),
(2), (4) Date: Sep. 25, 2012

(87) PCT Pub. No.: WO2013/001677
PCT Pub. Date: Jan. 3, 2013

(65) Prior Publication Data
US 2013/0043490 A1    Feb. 21, 2013

(30) Foreign Application Priority Data
Jun. 28, 2011    (JP) .................................. 2011-143351

(51) Int. Cl.
*H01L 29/24*    (2006.01)
*H01L 21/336*   (2006.01)

(52) U.S. Cl.
USPC ............... 257/77; 257/76; 257/328; 257/330; 257/E21.409; 438/589; 438/270; 438/105; 438/931

(58) Field of Classification Search
USPC ..................... 257/76, 77, 328, 330, E29.104, 257/E21.409; 438/589, 270, 105, 931
See application file for complete search history.

(56) References Cited

U.S. PATENT DOCUMENTS

| 5,915,180 A    | 6/1999 | Hara et al. |
| 7,414,286 B2 * | 8/2008 | Hirler et al. ................... 257/328 |

(Continued)

FOREIGN PATENT DOCUMENTS

| JP | 07-326755 A   | 12/1995 |
| JP | 2005-512342 T | 4/2005  |

(Continued)

OTHER PUBLICATIONS

International Search Report for corresponding International Application No. PCT/JP2012/000968 mailed Oct. 4, 2012.

(Continued)

*Primary Examiner* — Thinh T Nguyen
(74) *Attorney, Agent, or Firm* — Renner, Otto, Boisselle & Sklar, LLP

(57) ABSTRACT

The semiconductor device 100 of this invention includes: a semiconductor layer 2 arranged on the principal surface of a substrate 1 and made of a wide bandgap semiconductor; a trench 5 which is arranged in the semiconductor layer 2 and which has a bottom and a side surface; an insulating region 11 arranged on the bottom and side surface of the trench 5; and a conductive layer 7 arranged in the trench 5 and insulated from the semiconductor layer 2 by the insulating region 11. The insulating region 11 includes a gate insulating film 6 arranged on the bottom and the side surface of the trench 5 and a gap 10 arranged between the gate insulating film 6 and the conductive layer 7 at the bottom of the trench 5. The gate insulating film 6 contacts with the conductive layer 7 on a portion of the side surface of the trench 5 but does not contact with the conductive layer 7 at the bottom of the trench 5. The thickness of the insulating region 11 measured from the bottom of the trench 5 through the lower surface of the conductive layer 7 is greater around the center of the trench than beside its side surface.

17 Claims, 7 Drawing Sheets

(56) References Cited

U.S. PATENT DOCUMENTS

| | | |
|---|---|---|
| 7,919,388 B2 * | 4/2011 | Radic et al. .................. 438/424 |
| 2001/0053561 A1 | 12/2001 | Kitabatake et al. |
| 2003/0146470 A1 | 8/2003 | Hijzen et al. |
| 2006/0008991 A1 | 1/2006 | Hijzen et al. |
| 2006/0091453 A1 | 5/2006 | Matsuda et al. |
| 2006/0226451 A1 | 10/2006 | Davies |
| 2006/0226498 A1 | 10/2006 | Davies |
| 2007/0057289 A1 | 3/2007 | Davies |
| 2007/0090434 A1 | 4/2007 | Davies et al. |
| 2010/0032750 A1 | 2/2010 | Davies |

FOREIGN PATENT DOCUMENTS

| | | |
|---|---|---|
| JP | 2007-505505 T | 3/2007 |
| JP | 2007-242943 A | 9/2007 |
| JP | 2008-078175 A | 4/2008 |
| JP | 2008-171838 A | 7/2008 |

OTHER PUBLICATIONS

Form PCT/USA/237 for corresponding International Application No. PCT/JP2012/000968 dated Oct. 4, 2012.

* cited by examiner (a)

(b)

(a)

(b)

(c)

SEMICONDUCTOR DEVICE AND METHOD FOR FABRICATING THE DEVICE

TECHNICAL FIELD

The present invention relates to a semiconductor device that uses a wide bandgap semiconductor, and more particularly relates to an MIS semiconductor device with a trench gate structure and a method for fabricating such a device.

BACKGROUND ART

Wide bandgap semiconductors have been used extensively in various kinds of semiconductor devices including power elements (which will also be referred to herein as "power devices"), hostile-environment elements, high temperature operating elements, and radio frequency elements. In particular, application of such a material to power devices such as switching elements and rectifier elements has attracted a lot of attention.

Among those wide bandgap semiconductors, power devices that use silicon carbide (SiC) (which are also called "SiC power devices") have been developed particularly extensively because a SiC substrate can be made relatively easily and because silicon dioxide ($SiO_2$) can be obtained as a gate insulating film of quality by thermally oxidizing SiC.

Field effect transistors including a metal-insulator-semiconductor field effect transistor (MISFET) and a metal semiconductor field effect transistor (MESFET) are typical switching elements among various power devices that use SiC. Such a switching element can switch between ON state in which drain current of several amperes (A) or more flows and OFF state in which the drain current becomes zero by changing the voltages applied to between its gate and source electrodes. Also, in the OFF state, SiC will achieve as high a breakdown voltage as several hundred volts or more.

SiC has a higher dielectric breakdown voltage and a higher thermal conductivity than Si. That is why a power device that uses SiC (which will be referred to herein as a "SiC power device") can have a higher dielectric strength and will cause smaller loss than a Si power device. As a result, a SiC power device can operate at a higher temperature, under a higher voltage applied, and with a larger amount of current supplied, than a Si power device.

To make an even larger amount of current flow through a power device such as a MISFET, it is effective to increase the channel density. For that reason, a vertical power MISFET with a trench gate structure has been proposed as a replacement for a conventional planar gate structure. In the planar gate structure, a channel region is defined on the surface of a semiconductor layer. In the trench gate structure, on the other hand, a channel region is defined on the side surface of a trench that has been cut through a semiconductor layer (see Patent Document No. 3, for example).

Hereinafter, a cross-sectional structure of a vertical MISFET with the trench gate structure will be described with reference to the accompanying drawings. The vertical MISFET ordinarily has a plurality of unit cells that are arranged two-dimensionally. Each of those unit cells has a trench gate.

FIG. 5 is a cross-sectional view illustrating one cell pitch (i.e., a single unit cell) of a known vertical MISFET with the trench gate structure. In the example illustrated in FIG. 5, each unit cell has a trench gate, of which a side surface is substantially perpendicular to the principal surface of the substrate.

The vertical MISFET shown in FIG. 5 includes a substrate 1 of silicon carbide and a silicon carbide layer 2 that has been formed on the principal surface of the substrate 1. The silicon carbide layer 2 includes an n-type drift region 2$d$ that has been defined on the principal surface of the substrate 1 and a p-type body region 3 that has been defined on the drift region 2$d$. An n-type source region 4 forms part of the surface region of the body region 3. A trench 5 is formed in the silicon carbide layer 2 so as to run through the body region 3 and reach the drift region 2$d$. In this example, the trench 5 has a side surface that is perpendicular to the principal surface of the substrate 1. Inside of the trench 5, arranged are a gate electrode 7 and a gate insulating film 6 that insulates the gate electrode 7 from the silicon carbide layer 2. Further arranged on the silicon carbide layer 2 is a source electrode 8 that contacts with the source region 4. And a drain electrode 9 is arranged on the back surface of the substrate 1.

A vertical MISFET like this may be fabricated in the following manner.

First of all, on the principal surface of an n-type substrate 1 with low resistivity, formed is a silicon carbide layer 2 having the same crystal structure as the substrate 1. For example, an n-type drift region 2$d$ and a p-type body region 3 are defined in this order by epitaxial growth process on the principal surface of the substrate 1, thereby obtaining a silicon carbide layer 2. After that, a mask layer (not shown) of silicon dioxide is put on a predetermined area of the silicon carbide layer 2 and used as a mask through which n-type dopant ions (such as N (nitrogen) ions) are implanted into the body region 3, thereby defining a source region 4 in the body region 3.

After the mask has been removed, an Al film (not shown) is deposited on a part of the source region 4 with an oxide film interposed between them, and used as a mask, through which a trench 5 is cut to reach the drift region 2$d$.

Next, a gate insulating film 6 and a gate electrode 7 are formed in this order inside of the trench 5. The gate insulating film 6 may be an oxide film, which is obtained by thermally oxidizing the silicon carbide layer 2.

The gate electrode 7 may be formed by depositing polysilicon on the gate insulating film 6 by low pressure chemical vapor deposition (LP-CVD) process and then patterning it, for example. Meanwhile, a source electrode 8 is formed on the silicon carbide layer 2 to cover both the body region 3 and the source region 4, while a drain electrode 9 is formed on the back surface of the substrate 1. In this manner, a vertical MISFET with a trench gate structure is completed.

In a MISFET with such a trench gate structure, when the source electrode 8 and the gate electrode 7 are both grounded or when a negative bias voltage is applied to the gate electrode 7, holes are accumulated in the vicinity of the interface between the body region 3 and the gate insulating film 6 in the region between the source region 4 and the drift region 2$d$, and the path of electrons which are conduction carriers is cut off. As a result, no current flows (i.e., the MISFET turns OFF). In this case, if a high voltage is applied to between the drain electrode 9 and the source electrode 8 so that the drain electrode 9 has positive potential, then the pn junction between the body region 3 and the drift region 2$d$ becomes reverse biased. As a result, a depletion layer expands in the body region 3 and in the drift region 2$d$ and a high voltage can be maintained.

On the other hand, if a positive bias voltage that is equal to or higher than a threshold voltage is applied to the gate electrode 7, electrons are induced and inverted in the vicinity of the interface between the body region 3 and the gate insulating film 6 in the region between the source region 4 and the drift region 2$d$, and an inversion layer is formed there. As a result, carriers flow from the source electrode 8 toward the drain electrode 9 by way of the source region 4, the inversion layer (not shown) that that has been formed in the body region 3 and that contacts with the gate insulating film 6, the drift region 2d and the substrate 1. That is to say, the MISFET turns ON.

In a vertical MISFET with the planar structure, a junction field effect transistor (which will be abbreviated herein as "JFET") is formed as a parasitic transistor between adjacent unit cells and produces a resistive component (JFET resistance). This JFET resistance is produced when current flows through the drift region 2d that is interposed between adjacent body regions 3. The narrower the interval between those unit cells (i.e., the narrower the gap between the adjacent body regions 3), the greater the JFET resistance. That is why if the cell pitch is reduced to cut down the size, the ON-state resistance increases as the JFET resistance rises.

On the other hand, since the MISFET with the trench gate structure has no JFET resistance, the ON-state resistance decreases monotonically as the cell pitch is reduced, which is beneficial. For that reason, to cut down the size of a unit cell, it is more advantageous to adopt a MISFET with the trench gate structure.

In a MISFET with the trench gate structure, however, the intensity of the electric field applied to the gate insulating film 6 becomes very high, which is a problem. Hereinafter, that problem will be described in detail with reference to the accompanying drawings.

Portion (a) of FIG. 6 is an enlarged cross-sectional view illustrating the structure of a portion of the known MISFET shown in FIG. 5 inside of the dotted line A. Portions (b) and (c) of FIG. 6 show the distributions of electric field intensities in the PN junction portion 30 and the MIS structure portion 40, which are indicated by the dotted line in portion (a) of FIG. 6, in the OFF state (i.e., when a drain voltage is applied). The pn junction portion 30 is formed of the body region 3 and the drift region 2d, while the MIS structure portion 40 is formed of the gate electrode 7, the gate insulating film 6 and the drift region 2d.

When used as a power device, a MISFET is ideally designed so that breakdown occurs when the peak intensity of the electric field applied to the PN junction portion 30 exceeds the dielectric breakdown field of SiC (e.g., about 3 MV/cm for 4H—SiC). However, before the intensity of the electric field applied to the PN junction portion 30 reaches the dielectric breakdown field, the intensity of the electric field applied to the gate insulating film (of $SiO_2$, for example) 6 could reach the dielectric breakdown field at the bottom of the trench. For that reason, breakdown could occur at a voltage that is lower than the theoretical breakdown voltage.

The reason is that as the difference in relative dielectric constant between SiC (e.g., 9.7 for 4H—SiC) and the $SiO_2$ film (of 3.8) is smaller than the difference in relative dielectric constant between Si (of 11.9) and the $SiO_2$ film (of 3.8), an electric field with a higher intensity is applied to the gate insulating film 6 of the MIS structure portion 40 in the SiC power device than in the Si power device. Also, in general, an electric field will be concentrated at respective portions of the gate insulating film 6 at the bottom and corners of the trench and a higher electric field will be applied to those portions than anywhere else. Furthermore, in the Si device, Si has a dielectric breakdown field of 0.2 MV/cm, which is two-digit smaller than 10 MV/cm of the $SiO_2$ film. That is why in almost all cases, breakdown will occur in the PN junction portion of the Si device before breakdown occurs in the gate insulating film. In the SiC power device, on the other hand, SiC (4H—SiC) has as large a dielectric breakdown field as 3 MV/cm, which is much less different from that of the $SiO_2$ film (e.g., about 0.5 to 1 digit). For that reason, the breakdown could occur in the MIS structure portion 40 due to the dielectric breakdown of the gate insulating film 6 before breakdown occurs in the PN junction portion 30. As a result, the dielectric breakdown of the gate insulating film 6 in the MIS structure portion 40 raises an even more serious problem. In this manner, the dielectric breakdown of the gate insulating film 6 could limit the dielectric withstanding voltage of the MISFET.

Thus, to overcome such a problem, Patent Document Nos. 1 and 2 propose that the dielectric breakdown field be increased by thickening the gate insulating film at the bottom of the trench.

Specifically, Patent Document No. 1 proposes making a portion of the gate insulating film (which is a thermal oxide film) at the bottom of the trench thicker than another portion of the gate insulating film on the side surface of the trench by using a (0001) carbon plane with a higher oxidation rate as the bottom of the trench. On the other hand, according to the method proposed in Patent Document No. 2, first of all, a gate insulating film, a polysilicon film and a silicon nitride film are deposited in this order inside of the trench. Next, the silicon nitride film is etched to expose the polysilicon film at the bottom of the trench. Subsequently, the exposed polysilicon film is oxidized to form a silicon dioxide film. Thereafter, the residual portions of the silicon nitride film and polysilicon film on the side surface of the trench are removed. In this manner, only the portion of the gate insulating film at the bottom of the trench can be thickened selectively.

CITATION LIST

Patent Literature

Patent Document No. 1: Japanese Laid-Open Patent Publication No. 7-326755
Patent Document No. 2: Japanese Laid-Open Patent Publication No. 2007-242943
Patent Document No. 3: Japanese Laid-Open Patent Publication No. 2008-78175

SUMMARY OF INVENTION

Technical Problem

However, the present inventors discovered as a result of extensive researches that according to the methods proposed in Patent Documents Nos. 1 and 2, it is difficult to increase the thickness of the gate insulating film at the bottom of the trench sufficiently while keeping the thickness of the gate insulating film on the side surface of the trench (i.e., in the channel portion) a predetermined one. In addition, according to these known methods, it is also difficult to control and set the respective thicknesses of the gate insulating film on the side surface and at the bottom of the trench to be arbitrary ones independently of each other. Those results obtained by our extensive researches will be described in detail later.

The present inventors made our invention in order to overcome those problems in the related art, and an object of the present invention is to reduce the intensity of an electric field applied to around the bottom of the trench and eventually minimize the dielectric breakdown of the insulating film at the bottom of the trench in a semiconductor device with the trench structure without degrading the characteristic of the element.

Solution to Problem

The present disclosure provides a semiconductor device including: a substrate; a semiconductor layer which is arranged on the principal surface of the substrate and which is made of a wide bandgap semiconductor; a trench which is arranged in the semiconductor layer and which has a bottom and a side surface; an insulating region which is arranged on the bottom and side surface of the trench; and a conductive layer which is arranged in the trench and which is insulated from the semiconductor layer by the insulating region. The insulating region includes a gate insulating film that is arranged on the bottom and the side surface of the trench and a gap that is arranged between the gate insulating film and the conductive layer at the bottom of the trench. The gate insulating film contacts with the conductive layer on portion of the side surface of the trench but does not contact with the conductive layer at the bottom of the trench. And the thickness of the insulating region as measured from the bottom of the trench through the lower surface of the conductive layer is greater around the center of the trench than beside the side surface of the trench.

The present disclosure also provides a method for fabricating a semiconductor device, which includes the steps of: (A) providing a substrate, on the principal surface of which a semiconductor layer of a wide bandgap semiconductor in formed; (B) forming a trench, which has a bottom and a side surface, in the semiconductor layer; (C) forming a gate insulating film on the bottom and side surface of the trench; and (D) forming a conductive layer in the trench so that the conductive layer contacts with the gate insulating film on a portion of the side surface of the trench but does not contact with the gate insulating film at the bottom of the trench and that a gap is left between the conductive layer and the gate insulating film, thereby having an insulating region defined by the gap and the gate insulating film. The thickness of the insulating region as measured from the bottom of the trench through the lower surface of the conductive layer is greater around the center of the trench than beside the side surface of the trench.

Advantageous Effects of Invention

According to the semiconductor device disclosed in this description, a gap is selectively left at the bottom of a trench that is arranged in a semiconductor layer, thereby defining an insulating region, which is thicker at the bottom of the trench than on the side surface of the trench, between the conductive layer to be a gate electrode and the semiconductor layer inside of the trench. In addition, by setting the thickness of the insulating region at the bottom of the trench to be greater around the center of the trench than beside the side surface of the trench, it is possible to prevent the electric field from going excessively high around the center of the bottom of the trench. On top of that, the thicknesses of the insulating region on the side surface and bottom of the trench can be controlled arbitrarily independently of each other. Consequently, the intensity of the electric field applied to the insulating film at the bottom of the trench can be reduced and the dielectric breakdown can be minimized while maintaining good enough element characteristics.

Also, according to the semiconductor device fabricating method disclosed in this description, such a semiconductor device can be fabricated without making the manufacturing process a complicated one.

DESCRIPTION OF EMBODIMENTS

Figure 7:
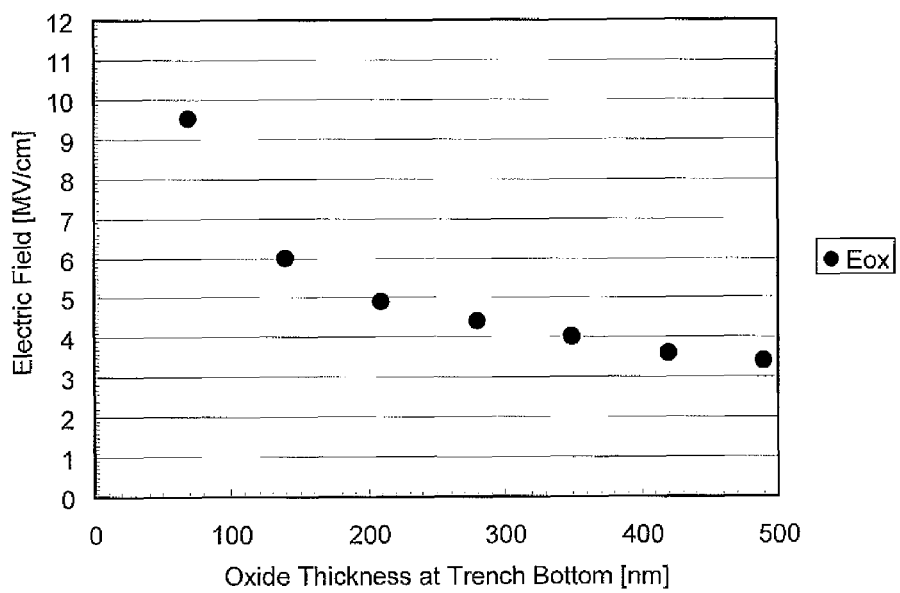
FIG. 7 A graph showing the results of simulations that were carried out to find how the intensity of an electric field applied to an insulating film at the bottom of a trench would vary with the thickness of the insulating film at that trench bottom.

FIG. 7 shows, based on the results of the simulation that was carried out by the present inventors, how the intensity of an electric field applied to the bottom of a trench changes with the thickness of a gate insulating film (thermal oxide film) at that location. Specifically, in this example, it was calculated how the intensity of the electric field applied to the bottom of the trench changed with the thickness of the gate insulating film at that trench bottom when 1200 V was applied to the drain electrode. The thickness of the gate insulating film in a channel portion on the side surface of the trench was supposed to be 70 nm and the breakdown voltage at the junction between the drift region and the body region was supposed to be 1200 V or more.

Normally, the dielectric breakdown field of a thermal oxide film is 10 MV/cm or more. When a thermal oxide film is applied to an electronic device, however, the permissible electric field intensity is set to be much lower than the actual breakdown field (and may be set to be 3 to 4 MV/cm, for example) in order to ensure long-term reliability. That is to say, it is beneficial to reduce the intensity of the electric field applied to around the bottom of the trench to 4 MV/cm or less to say the least.

It can be seen from the graph shown in FIG. 7 that when the thickness of the gate insulating film at the trench bottom is 70 nm, which is approximately equal to that of the gate insulating film on the side surface of the trench, the electric field intensity exceeds 9 MV/cm. It can also be seen that even if the thickness of the gate insulating film at the trench bottom is set to be 140 nm, which is twice as large as its thickness on the side surface of the trench, an electric field of 6 MV/cm is still applied to the trench bottom. To set the intensity of the electric field at that trench bottom to be 4 MV/cm or less, the thickness of the gate insulating film at that trench bottom may be set to be 350 nm or more, i.e., at least five times as large as its thickness on the side surface of the trench (i.e., in the channel portion).

According to the method proposed in Patent Document No. 1, the thickness of the gate insulating film at the trench bottom is selectively increased by taking advantage of the plane orientation dependence of the oxidation rate of silicon carbide. It is difficult to set the thickness of the gate insulating film at the trench bottom to be much greater than (e.g., five or more times as large as) its thickness on the side surface of the trench by such a method. On top of that, according to such a method, it is impossible to control the thicknesses of the gate insulating film at the bottom and on the side surface of the trench independently of each other. For that reason, it is hard to reduce the electric field applied to the trench bottom to a predetermined value or less while maintaining good enough transistor performance, and the dielectric breakdown of the gate insulating film could not be avoided completely.

The method disclosed in Patent Document No. 2 not only requires a complicated process but also uses a film obtained by oxidizing a polysilicon film as a gate insulating film, thus decreasing the dielectric breakdown field of the gate insulating film itself, which is a problem. For that reason, to avoid the dielectric breakdown successfully, a thicker polysilicon film should be oxidized. However, the thicker the polysilicon film, the more difficult it is to form a thermal oxide film. Consequently, it is hard to set the thickness of the gate insulating film at the trench bottom to be much greater than its thickness on the side surface of the trench.

Meanwhile, the gate insulating film could be formed by embedding an insulating film in the trench. Such an embedded film, however, would have a substantially uniform thickness at every corner and center of the trench. That is why with such a method adopted, it is also difficult to set the thickness of the gate insulating film at the trench bottom to be much greater than its thickness on the side surface of the trench and those thicknesses cannot be controlled independently of each other, either.

In the foregoing description, problems with the related art have been described as to a silicon carbide MISFET that is taken as an example. However, a semiconductor device that uses any other wide bandgap semiconductor such as GaN, AlN or diamond instead of silicon carbide also has a similar problem.

In view of these considerations, the present inventors searched for, and finally found, a structure that could reduce the intensity of an electric field applied to the trench bottom while maintaining good enough element characteristics, thus getting the basic idea of our invention.

Embodiment 1

Hereinafter, a first embodiment of a semiconductor device according to the present invention will be described with reference to the accompanying drawings. The semiconductor device of the first embodiment is a silicon carbide MISFET with a trench gate structure. However, this embodiment does not have to be applied to such a silicon carbide MISFET but may also be applicable to any other silicon carbide semiconductor device such as a silicon carbide MESFET or a semiconductor device that uses any other wide bandgap semiconductor (such as GaN, AlN or diamond) instead of silicon carbide.

The semiconductor device of this embodiment includes a plurality of unit cells that are arranged two-dimensionally. FIG. 1(a) is a cross-sectional view illustrating a part of the semiconductor device 100 and FIG. 1(b) is a plan view illustrating an exemplary arrangement of a unit cell 100U on the surface of the silicon carbide layer of the semiconductor device 100. FIG. 1(a) is a cross-sectional view as viewed on the plane I-I' shown in FIG. 1(b).

The unit cell 100U of the semiconductor device 100 includes a substrate 1 including silicon carbide and a silicon carbide layer (semiconductor layer) 2 which is arranged on the surface (i.e., the principal surface) of the substrate 1 and which consists essentially of silicon carbide. The silicon carbide layer 2 has a drift region 2d of a first conductivity type (e.g., n-type in this example) which is defined on the principal surface of the substrate 1, and a body region 3 of a second conductivity type (e.g., p-type in this example) which is defined on the drift region 2d. Also, a source region 4 of the first conductivity type (n-type) is arranged to form part of the surface region of the body region 3. In the example illustrated in FIG. 1, the source region 4 is surrounded with the body region 3 on the upper surface of the silicon carbide layer 2. The source region 4 is equivalent to the doped region of the first conductivity type of the claimed invention.

The silicon carbide layer 2 has a trench 5 which runs through the body region 3 and the source region 4 to reach the drift region 2d. An insulating region 11 is arranged on the bottom and on the side surface of the trench 5. And a conductive layer to function as a gate electrode 7 is arranged to fill the trench 5. The gate electrode (conductive layer) 7 and the silicon carbide layer 2 are insulated from each other by the insulating region 11.

In this embodiment, the insulating region 11 is made up of a gate insulating film 6 which is arranged on the side surface and bottom of the trench 5 and a gap 10 which is arranged between the gate insulating film 6 and the gate electrode 7 at the bottom of the trench 5. The gate insulating film 6 contacts with the gate electrode 7 on a portion of the side surface of the trench 5. The gap 10 may be an air gap, for example, and is located between a first portion 6b of the gate insulating film 6 on the bottom of the trench 5 and the gate electrode 7. That is why the first portion 6b of the gate insulating film 6 does not contact with the gate electrode 7. Also, the thickness of the insulating region 11 at the bottom of the trench 5 (i.e., as measured from the bottom of the trench 5 to the lower surface of the gate electrode 7) is greater around the center of the trench 5 than beside the side surface of the trench 5. In other words, a portion q of the lower surface of the gate electrode 7 (i.e., the surface opposed to the bottom of the trench 5) which is located beside the side surface of the trench 5 is deeper than another portion p thereof which is located around the center of the trench 5.

By defining the insulating region 11 consisting of the gate insulating film 6 and the gap 10 with the gap 10 arranged between the gate insulating film 6 and the gate electrode 7 at the bottom of the trench 5 in this manner, the intensity of the electric field around the bottom of the trench 5 can be prevented from becoming excessively high. In addition, by setting the thickness of the insulating region 11 at the center of the bottom of the trench 5 to be greater than its thickness beside the side surface of the trench 5, it is also possible to prevent the intensity of the electric field from becoming too high around the center of the bottom of the trench 5.

A portion q of the lower surface of the gate electrode 7 which is located beside the side surface of the trench 5 is suitably located deeper than the interface r between the body region 3 and the drift region 2d. In that case, a channel can be formed just as intended between the source region 4 and the drift region 2d, and therefore, the intensity of the electric field applied to the bottom of the trench 5 can be reduced without increasing the ON-state resistance.

Figure 1:
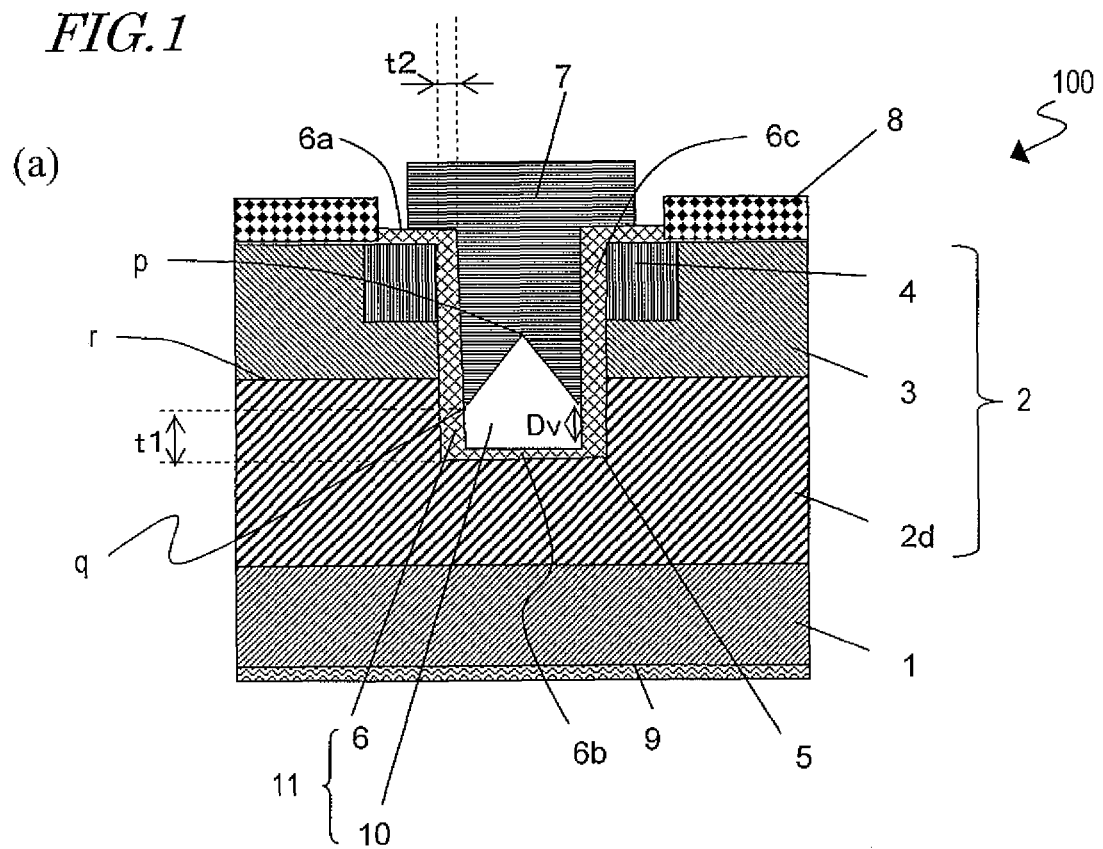
FIGS. 1(a) and (b) are respectively a cross-sectional view and a plan view schematically illustrating a semiconductor device as a first embodiment of the present invention.
Figure 1:
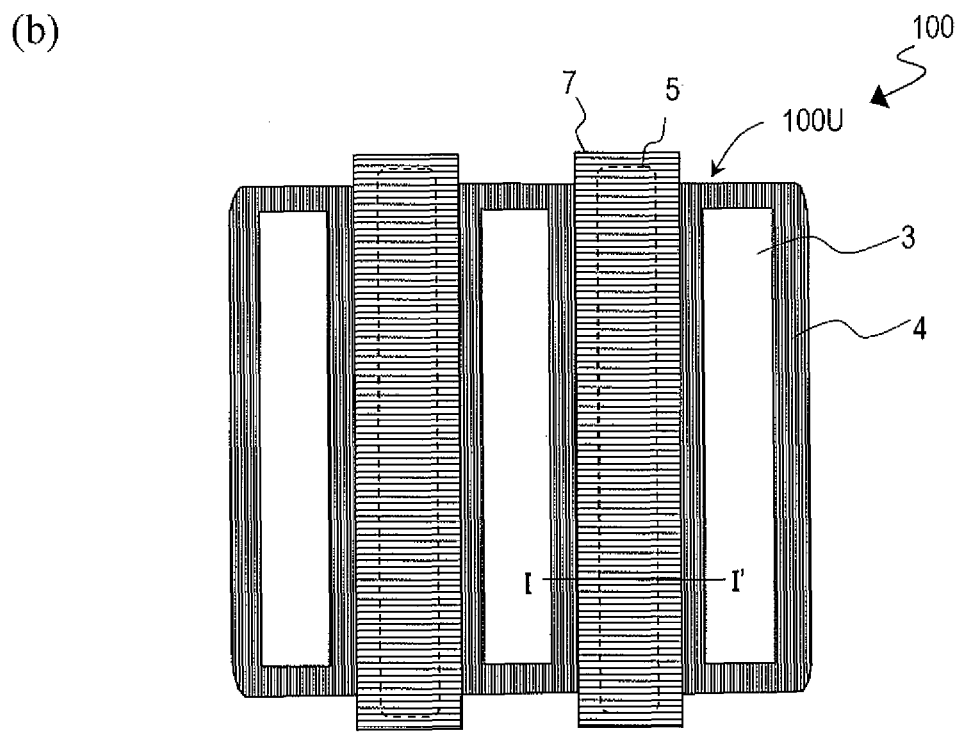

In the example illustrated in FIG. 1, the lower surface of the gate electrode 7 is in contact with the gap 10. The portion q of the interface between the gate electrode 7 and the gap 10 which is located beside the side surface of the trench 5 is deeper than the interface r between the body region 3 and the drift region 2d. That is why there is no gap 10 between a second portion 6c of the gate insulating film 6, which is located on the body region 3 (i.e., the channel portion) that is exposed on the side surface of the trench 5, and the gate electrode 7. That is to say, at least that second portion 6c of the gate insulating film 6 contacts with the gate electrode 7. Consequently, by controlling the thickness of the gate insulating film 6, the threshold voltage and other characteristics can be maintained.

Meanwhile, a portion p of the lower surface of the gate electrode 7, which is located around the center of the trench 5, is suitably shallower than the interface r between the body region 3 and the drift region 2d. In that case, the insulating region 11 can be even thicker around the center of the trench 5, and therefore, the intensity of the electric field applied to the bottom of the trench 5 can be reduced even more effectively.

It is even more beneficial to define the interface r between the body region 3 and the drift region 2d deeper than the portion p but shallower than the portion q (i.e., to satisfy "depth of portion p<depth of interface r<depth of portion q). Then, the intensity of the electric field applied to the bottom of the trench 5 can be reduced even more effectively with good transistor characteristics (i.e., ON-state performance) maintained.

It is recommended that the gap 10 be taller around the center of the trench 5 than beside the side surface of the trench 5. In that case, no matter what shape the bottom of the trench 5 has or how thick the gate insulating film 6 is at the bottom of the trench 5, the insulating region 11 at the bottom of the trench 5 can always be thicker around the center of the trench 5 than beside the side surface of the trench 5. In the example illustrated in FIG. 1, the gap 10 has such a shape that projects toward the gate electrode Such a gap 10 can be formed easily by the process to be described later.

In the example illustrated in FIG. 1(a), the bottom of the trench 5 is substantially parallel to the principal surface of the substrate 1 and the side surface of the trench 5 is substantially perpendicular to the principal surface of the substrate 1. However, the trench 5 does not have to have such a cross-sectional shape. Alternatively, the bottom of the trench 5 may be deeper around its center than beside its side surface. In that case, the bottom of the trench 5 projects toward the depth (i.e., toward the substrate 1), while the lower surface of the gate electrode 7 projects toward the surface. Consequently, the insulating region 11 at the bottom of the trench 5 can be even thicker around the center of the trench 5, and the intensity of the electric field applied there can be reduced even more effectively.

The gate insulating film 6 may be a silicon dioxide film, a silicon oxide film including nitrogen (N), a nitride film, an oxide film or a multilayer film including at least one of nitride and oxide films. The gate insulating film 6 is suitably a thermal oxide film obtained by subjecting the silicon carbide layer 2 to a heat treatment but may also be a deposition film. The gap 10 is a space between the gate insulating film 6 and the gate electrode 7 and will also be referred to herein as a "gap layer", which may be a gas layer of a gas such as the air. The gas contained in the gap 10 may be the air or the atmospheric gas that has been used to form the gate electrode 7. The gate electrode 7 may be a polysilicon layer that has been doped with phosphorus to a concentration of $1\times10^{20}$ cm$^{-3}$ or more, for example.

As already described with reference to FIG. 7, the insulating region 11 is suitably thicker at the bottom of the trench 5 than on the side surface of the trench 5 (i.e., on the body region 3). Supposing the minimum thickness of the insulating region 11 at the bottom of the trench 5 (i.e., its thickness as measured beside the side surface of the trench 5 from the bottom of the trench 5 through the lower surface of the gate electrode 7) is t1 and the thickness of the insulating region 11 on the side surface of the trench 5 is t2, it is recommended that the thickness t1 be at least five times as large as the thickness t2. In the example illustrated in FIG. 1(a), the thickness t1 of the insulating region 11 at the bottom of the trench 5 is the sum of the thickness of the first portion 6b of the gate insulating film 6 and the height Dv of the gap 10. In this description, the thickness t2 of the insulating region 11 on the side surface of the trench 5 means the thickness of the insulating region 11 on the surface (i.e., the channel portion) of the body region 3 that is exposed on the side surface of the trench 5. In the example illustrated in FIG. 1, the thickness t2 is the thickness of the second portion 6c of the gate insulating film 6. The thickness t1 means the minimum thickness of the insulating region 11 at the bottom of the trench 5. Also, the thickness Dv of the gap 10 means the distance as measured along a normal to the principal surface of the substrate 1 from the upper surface of the first portion 6b of the gate insulating film 6 through the lower surface of the gate electrode 7. Unless the lower surface of the gate electrode 7 or the upper surface of the gate insulating film 6 is flat, the height Dv means the minimum value of that distance. The gate electrode 7 of this embodiment is equivalent to the conductive layer of the claimed invention.

The semiconductor device 100 further includes a source electrode 8 which is arranged on the silicon carbide layer 2 and a drain electrode 9 which is arranged on the back surface of the substrate 1. The source electrode 8 is electrically connected to the source region 4 and the body region 3. The source electrode 8 and the gate electrode 7 are covered with an interlevel dielectric film (not shown), on which arranged is a source line (not shown). The source line is electrically connected to the source electrode 8 inside of a contact hole that has been cut through the interlevel dielectric film.

In the semiconductor device 100 of this embodiment, by selectively leaving the gap 10 at the bottom of the trench 5, a thicker insulating region 11 can be defined at the bottom of the trench 5 than on the side surface of the trench 5. In addition, the thicknesses of the insulating region 11 on the side surface and bottom of the trench 5 can be controlled arbitrarily independently of each other. On top of that, by making the insulating region 11 at the bottom of the trench 5 thicker around the center of the trench 5 than beside the side surface of the trench 5, the intensity of the electric field generated around the center of the trench 5 can be reduced. As a result, the intensity of the electric field generated at the bottom of the trench 5 can be reduced easily and the dielectric breakdown can be minimized with good element characteristics maintained. Moreover, since there is no need to form a thick oxide film at the bottom of the trench 5, introduction of crystal imperfections into the drift region 2d due to the stress caused by the oxide film being formed can be reduced compared to the related art. The reason will be described below.

In the semiconductor devices disclosed in Patent Documents Nos. 1 and 2, a thick thermal oxide film needs to formed at the bottom of the trench to increase the thickness of the gate insulating film there. However, the present inventors discovered via experiments that if a relatively thick thermal oxide film was deposited at the bottom of the trench to be twice or more as thick as its portion on the sidewall, defects were more likely to be introduced into the silicon carbide layer. The reason is that as a surface portion of the silicon carbide layer increases its volume due to oxidation through the process of forming such a thermal oxide film, stress would be applied to the corners of the trench bottom and could disturb the crystallinity at those corner portions. As a result, defects would be produced more easily in the silicon carbide layer, thus possibly decreasing the breakdown voltage of the semiconductor device or increasing the leakage current. On the other hand, according to this embodiment, since the thickness t1 of the insulating region 11 can be increased by leaving the gap 10 at the bottom of the trench, there is no need to form a thick thermal oxide film by oxidizing the silicon carbide at the bottom of the trench 5. That is why stress would be hardly caused to the silicon carbide layer 2 due to the oxidation of a surface portion of the silicon carbide layer 2, and therefore, introduction of defects into the silicon carbide layer 2 owing to the formation of the thermal oxide film can be reduced. Consequently, long-term reliability can be ensured more easily.

In addition, according to this embodiment, the gate insulating film 6 can have its thickness controlled to any arbitrary value, and therefore, threshold voltage and other characteristics can be maintained. Meanwhile, by controlling the height of the gap 10, the thickness t1 of the insulating region 11 as measured from the bottom of the trench 5 can be controlled independently of the thickness of the gate insulating film 6. In this manner, the respective thicknesses t2 and t1 of the insulating region 11 on the side surface (in the channel portion, in particular) and bottom of the trench 5 can be set arbitrarily independently of each other.

Also, in the known semiconductor device that uses a wide bandgap semiconductor, the insulating film arranged on the bottom of the trench is in contact with the gate electrode with no gap left between them. That is why if such a semiconductor device is operated at a high temperature, stress will be applied to the insulating film due to a difference in coefficient of thermal expansion between the respective materials of the insulating film and the gate electrode. On the other hand, according to this embodiment, as the gap 10 is left between the first portion 6b of the gate insulating film 6 and the gate electrode 7, that first portion 6b does not contact with the gate electrode 7. That is why the stress to be applied to the gate insulating film 6 due to the difference in coefficient of expansion can be reduced significantly compared to the related art, and deterioration of the gate insulating film 6 can be minimized.

It is recommended that the gate insulating film 6 be a thermal oxide film obtained by oxidizing a surface portion of the silicon carbide layer 2. As the thickness of a thermal oxide film depends on the crystallographic plane orientation, the thermal oxide film could be thinner on the bottom of the trench 5 than on its side surface. In that case, the portions 6b and 6a of the gate insulating film 6 which are located on the bottom of the trench 5 and on the surface of the silicon carbide layer 2, respectively, become less thick than its portion 6c on the side surface of the trench 5 (i.e., located in the channel portion). If the gap 10 is arranged at the bottom of the trench 5 in a semiconductor device with such a gate insulating film 6, the effect of preventing a dielectric breakdown from being produced at the bottom of the trench 5 can be achieved particularly significantly.

<Method For Fabricating Semiconductor Device 100>

Hereinafter, an exemplary method for fabricating the semiconductor device 100 according to this embodiment will be described with reference to the accompanying drawings.

FIGS. 2A through 2F are cross-sectional views illustrating respective manufacturing process steps to fabricate the semiconductor device according to this embodiment.

Figure 2A:
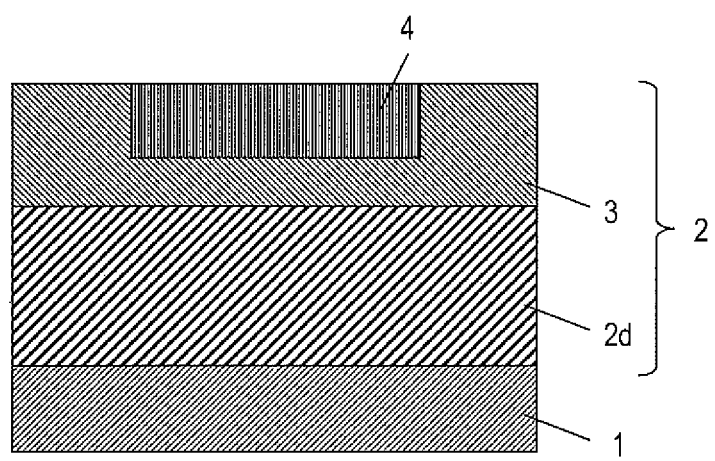
FIG. 2A A schematic cross-sectional view illustrating a manufacturing process step to fabricate the semiconductor device of the first embodiment.

First of all, as shown in FIG. 2A, silicon carbide is grown epitaxially on the principal surface of a substrate 1, thereby defining a drift region 2d of a first conductivity type (e.g., n-type in this example) and a body region 3 of a second conductivity type (e.g., p-type in this example) in this order and obtaining a silicon carbide layer 2. After that, a source region 4 is defined in the body region 3.

As the substrate 1, a low-resistivity n-type SiC substrate including nitrogen in a concentration of $3 \times 10^{18}$ cm$^{-3}$ may be used, for example. The drift region 2d has been doped with nitrogen to a level of $8 \times 10^{15}$ cm$^{-3}$, for example, and may have a thickness of 12 μm, for example. It should be noted that the thickness and dopant concentration of the drift region 2d are determined by the breakdown voltage required, and do not have to have these values.

Meanwhile, the body region 3 has been doped with aluminum to a level of $2 \times 10^{18}$ cm$^{-3}$, and may have a thickness of 700 nm to 800 nm, for example.

Even though the body region 3 is supposed to be grown epitaxially in this example, the body region 3 may also be formed by ion implantation instead. Specifically, the body region 3 may be formed by growing epitaxially an n-type silicon carbide layer 2 and then implanting ions of a p-type dopant into a surface region thereof. In that case, the rest of the silicon carbide layer 2, to which the p-type dopant has not been implanted, becomes the drift region 2.

The source region 4 may be defined by ion implantation, for example. In that case, first of all, a predetermined region of the silicon carbide layer 2 is selectively masked with a mask layer (not shown) of silicon dioxide film, for example. Next, using the mask layer as an implant mask, n-type dopant ions (e.g., nitrogen ions) are implanted into a portion of the body region 3 where the source region is going to be defined. In this example, the acceleration energy is set to be 100 keV and the dose is set to be $5 \times 10^{15}$ cm$^{-2}$. Subsequently, the mask layer is removed and then an annealing process is carried out at a temperature of 1700° C., for example, for 30 minutes within an inert gas atmosphere. As a result, the dopant ions implanted get activated and the source region 4 can be obtained. The source region 4 may have a thickness of 200 nm to 300 nm.

Figure 2B:
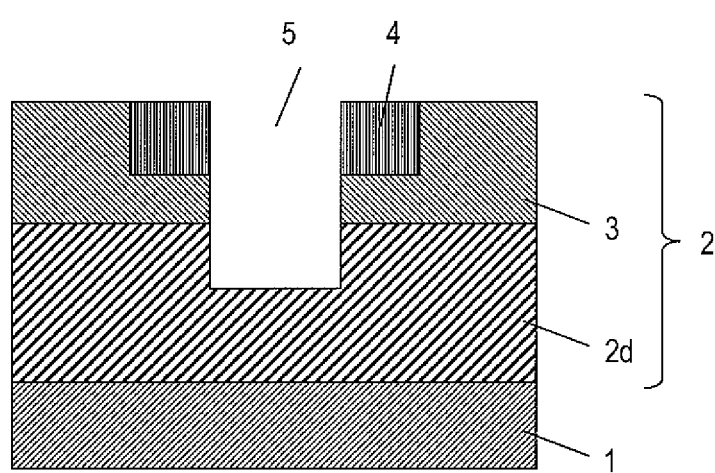
FIG. 2B A schematic cross-sectional view illustrating another manufacturing process step to fabricate the semiconductor device of the first embodiment.

Next, as shown in FIG. 2B, a trench (or a recess in any other shape) 5 is formed in the silicon carbide layer 2 to run through the source region 4 and the body region 3 and have its bottom located in the drift region 2d. In this embodiment, first of all, an oxide film (not shown) is deposited on a part of the source region 4 and a reactive ion etching (RIE) process is carried out using that oxide film as a mask, thereby forming a trench (with a depth of 1.5 μm and a width of 1 μm, for example) 12 in the silicon carbide layer 2. Although the side surface of the trench 5 is illustrated in FIG. 2B to be substantially perpendicular to the principal surface of the substrate 1, the trench 5 may also have a side surface that tilts with respect to a normal to the principal surface of the substrate 1 (i.e., may have a tapered shape or an inverted tapered shape).

Figure 2C:
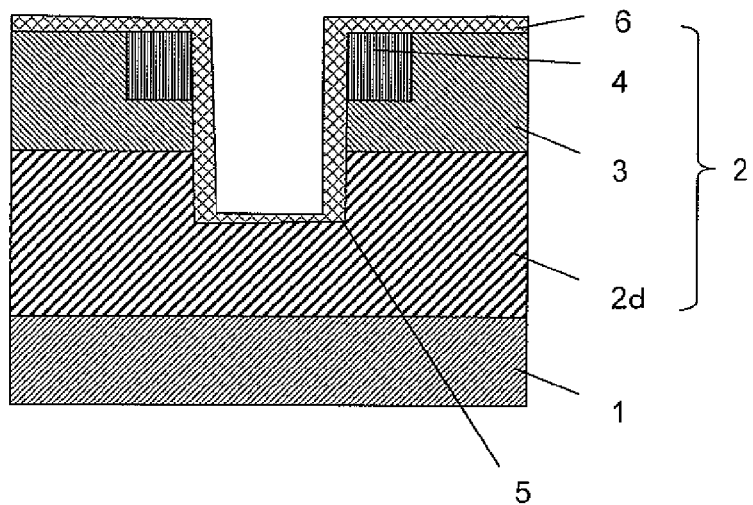
FIG. 2C A schematic cross-sectional view illustrating another manufacturing process step to fabricate the semiconductor device of the first embodiment.

Next, as shown in FIG. 2C, a gate insulating film 6 (with a thickness of 30 nm to 100 nm, for example) is formed on the side surface and bottom of the trench 5. In this example, by performing a process at 1200° C. for half an hour within a dry oxidizing atmosphere, a silicon dioxide film is deposited as the gate insulating film 6 on the side surface and bottom of the trench 5. The silicon dioxide film may have a thickness of 70 nm, for example, on the side surface of the trench 6. Optionally, the gate insulating film 6 may be a silicon dioxide film including nitrogen. In that case, the number of interface levels can be reduced at the interface of the gate insulating film and an increase in channel mobility can be expected.

Figure 2D:
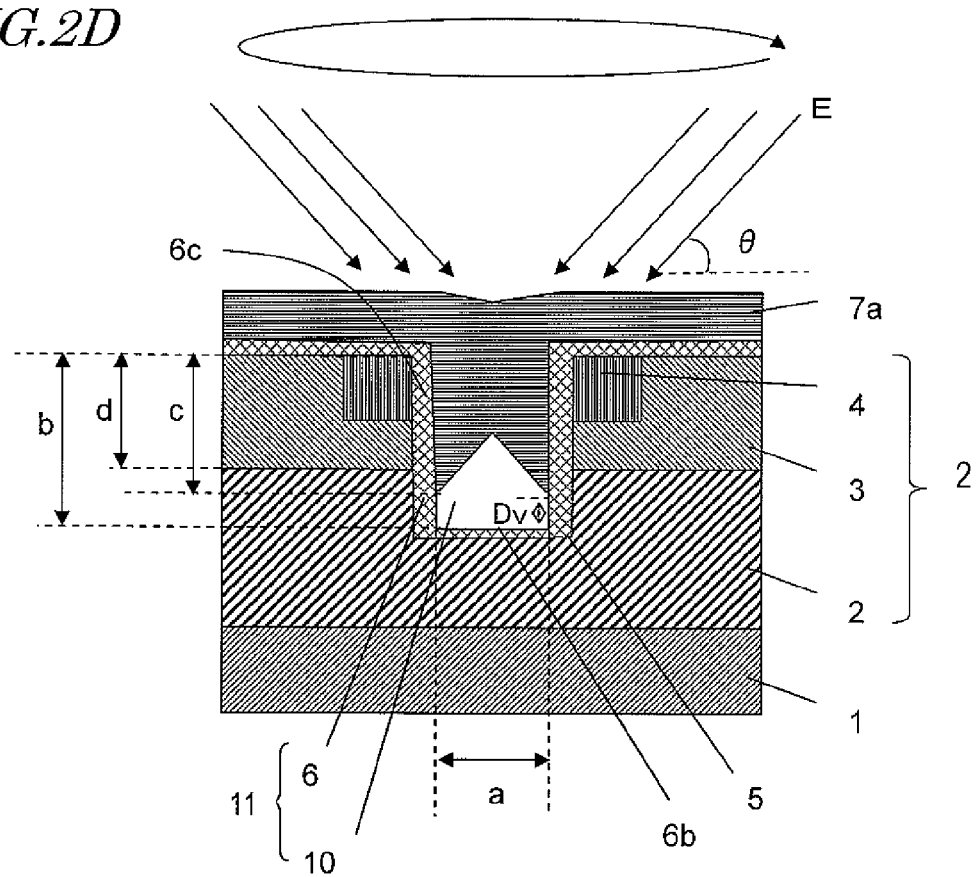
FIG. 2D A schematic cross-sectional view illustrating another manufacturing process step to fabricate the semiconductor device of the first embodiment.

Subsequently, as shown in FIG. 2D, an electrode material to be eventually patterned into a gate electrode (such as doped polysilicon) is deposited inside the trench 5 and over the upper surface of the silicon carbide layer 2, thereby obtaining a conductive film 7a, which is formed to contact with the portion 60 of the gate insulating film 6 that is located on the body region 3. As the method of depositing this electrode material, a method for setting the coverage to be lower on the bottom and side surface of the trench 5 than on the surface of the substrate is adopted so as to selectively prevent the electrode material from being deposited on the bottom of the trench 5 and at the corner portion between the bottom and side surface of the trench 5. As a result, a gap 10 is left at the bottom of the trench 5 between the gate insulating film 6 and the conductive film 7a. The gap 10 is left at the bottom of the trench 5 and is defined by the upper surface of the gate insulating film 6 and the lower surface of the conductive film 7a. Therefore, this gap 10 is different from a slit or void to be produced in the film being deposited to fill a trench. Since the gap 10 is left, the conductive film 7a does not contact with the first portion 6b of the gate insulating film 6 which is located on the bottom of the trench 5. In this manner, an insulating region 11 formed of the gate insulating film 6 and the gap 10 is obtained.

In this embodiment, the conductive film 7a is formed by sputtering process. In this case, the electrode material to deposit may come from a direction that defines a tilt angle with respect to a normal to the surface of the substrate (or wafer) 1. Such a direction will be referred to herein as a "sputtering direction" and a sputtering process like this will be referred to herein as an "oblique sputtering process". The oblique sputtering process may be carried out either with the substrate (or wafer) 1 rotated within a plane that is parallel to its principal surface or from multiple predetermined directions (i.e., sputtering directions) with the substrate 1 standing still. In the latter case, the sputtering directions are defined so as to deposit the electrode material on a portion of the side surface of the trench 5 to be a channel.

In the example illustrated in FIG. 2D, the sputtering process is carried out from a predetermined direction (which will be referred to herein as a "first direction") E with the substrate 1 rotated. In this case, supposing the angle defined by the sputtering direction E with respect to the principal surface of the substrate 1 (which will be referred to herein as a "sputtering angle") is $\theta$ (where $0<\theta<90$ degrees), the width and depth of the trench 5 are a and b, respectively, the depth of the gate electrode 7 is c, and the depth of the body region 3 is d, the depth c of the gate electrode 7 is calculated by a×tan $\theta$ (i.e., c=a×tan $\theta$). It should be noted that the depth c of the gate electrode 7 means the depth of the deepest portion of the lower surface of the gate electrode 7 (i.e., its maximum depth) and corresponds to the depth of the conductive film 7a on the side surface of the trench 5. Also, all of these depths b, c, and d are supposed to be measured from the upper surface of the silicon carbide layer 2.

The sputtering angle $\theta$ is suitably set so as to satisfy the inequality $$b > a \times \tan \theta > d$$

By setting the sputtering angle $\theta$ so as to satisfy this inequality, the electrode material can be deposited to a level that is even deeper than the interface between the drift region 2d and the body region 3 without being deposited on the bottom of the trench 5 or at the corner portion between its bottom and side surface. As a result, in the ON state, a channel (i.e., an inversion layer) can be formed more securely near the surface of the body region 3 that is exposed on the side surface of the trench 5. Consequently, the drift region 2d and the source region 4 can be connected together through the channel and current can be made to flow between them. In addition, by controlling the sputtering angle $\theta$, the depth c of the gate electrode 7 (stated otherwise, the height of the gap 10) can be adjusted to any arbitrary value.

In this embodiment, as the gap 10 is left on the gate insulating film 6 at the bottom of the trench 5 and at the corner portion between its bottom and side surface, both the gap 10 and the gate insulating film 6 work as an insulating region. That is why if the height of the gap 10 is adjusted by controlling the angle $\theta$, for example, and if the thickness of the insulating region 11 on the bottom of the trench 5 (i.e., the thickness of the apparent insulating layer) is set to be greater than 350 nm, for example (i.e., b−c>350 nm), then the intensity of the electric field applied to the bottom of the trench 5 can be reduced to 4 MV/cm or less. It should be noted that the "thickness of the insulating region 11 on the bottom of the trench 5" means the minimum thickness of the insulating region 11 as measured from the bottom of the trench 5 through the lower surface of the gate electrode 7. According to this embodiment, the effect described above can be achieved even without forming a thick oxide film separately on the bottom of the trench 5, which is beneficial.

In this example, the sputtering angle $\theta$ is set to be 45 degrees. In that case, the depth c of the gate electrode 7 becomes 1 μm (==width a (of 1 μm) of the trench×tan 45°). The depth c of the gate electrode 7 is smaller than the depth b (of 1.5 μm) of the trench 5 but greater than the depth d (in the range of 700 to 800 nm) of the interface r between the drift region 2d and the body region 3. That is why a channel (inversion layer) can be formed on the body region 3 on the side surface of the trench 5 and the source region 4, the drift region 2d and the channel can be connected together more securely. Also, the thickness of the insulating region 11 on the bottom of the trench 5 (i.e., the sum of the height of the gap 10 and the thickness of the gate insulating film 6) becomes approximately 1 μm around the center of the trench 5 and 500 nm (=b−c) beside the side surface of the trench 5.

It should be noted that if the substrate 1 is rotated, then the oblique sputtering process is carried out from every direction with respect to a normal to the principal surface of the substrate 1. For that reason, it is recommended that the trench 5 run perpendicularly to the principal surface of the substrate 1 and have such a cross-sectional shape as having substantially the same maximum width (=a) when viewed in any arbitrary direction.

Alternatively, the oblique sputtering may also be carried out with the substrate 1 standing still as described above. In that case, the oblique sputtering process is suitably performed from at least two opposing directions when viewed along a normal to the principal surface of the substrate 1. For example, if trenches 5 running in stripes are used, the oblique sputtering may be carried out along the normal with respect to the major axis direction of the trenches 5. On the other hand, if the sputtering process is carried out with the substrate 1 rotated, then the particles will also be sputtered in the major axis direction in which those trenches 5 run when viewed along a normal to the principal surface of the substrate 1. However, if the size of the trenches 5 as measured in the major axis direction were too large, the particles could reach the bottom of the trenches 5 when sputtered from the major axis direction. Meanwhile, if the sputtering directions when viewed along a normal to the principal surface of the substrate 1 are limited to only two directions that intersect with the major axis direction of the trenches 5 at right angles, the gap 10 can be left at the bottom of each of those trenches even more securely.

Suppose the sputtering process is carried out from not only the direction that intersects with the major axis direction of the trench 5 at right angles (which will be referred to herein as a "first direction") but also from a second direction that is opposed to the first direction when viewed along a normal to the principal surface of the substrate 1. In that case, if the angle defined between each sputtering direction and the principal surface of the substrate 1 (i.e., the sputtering angle) is θ (where 0<θ<90 degrees), the width of the trench 5 as measured on a cross section including those sputtering directions (i.e., the width as measured in the minor axis direction in this example) is a', the depth of the trench 5 is b, the depth of the gate electrode 7 is c, and the depth of the body region 3 is then the (maximum) depth c of the gate electrode 7 is calculated by a'×tan θ (i.e., c=a'×tan θ). The sputtering angle θ is suitably set so as to satisfy the inequality $$b > a' \times \tan\theta > d$$

Then, the electrode material can be deposited to a level that is even deeper than the interface between the drift region 2d and the body region 3 without being deposited on the bottom of the trench 5 or at the corner portion between its bottom and side surface. Furthermore, if the sputtering angle θ is set so that the thickness of the insulating region 11 on the bottom of the trench 5 becomes greater than 350 nm, for example (i.e., so as to satisfy b−c (=b−a'×tan θ)>350 nm), the intensity of the electric field applied to the bottom of the trench 5 can be reduced to 4 MV/cm or less.

In the example illustrated in FIG. 2D, the height Dv of the gap 10 becomes the distance from the first portion 6b of the gate insulating film 6 to a portion of the conductive film 7a located beside the side surface of the trench 5 (i.e., the distance as measured along a normal to the principal surface of the substrate 1). The height Dv is not limited to any particular value but is suitably 200 nm or more in order to reduce the overconcentration of the electric field toward the bottom of the trench 5 more effectively.

Figure 2E:
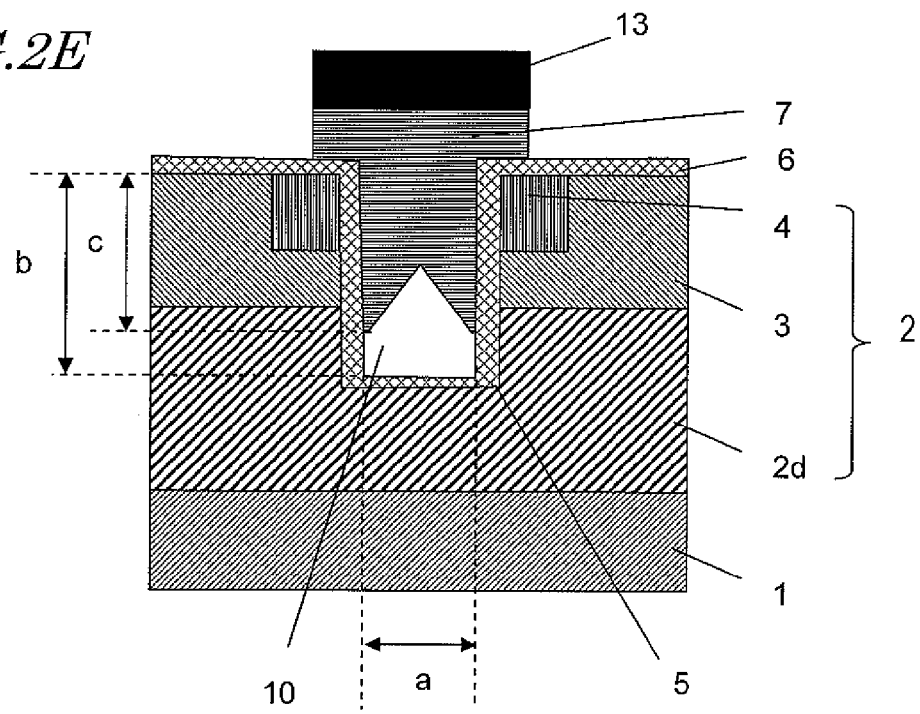
FIG. 2E A schematic cross-sectional view illustrating another manufacturing process step to fabricate the semiconductor device of the first embodiment.

Subsequently, as shown in FIG. 2E, a photoresist 13 is deposited on the conductive film 7a so as to expose the entire surface of the film but the region with the trench 5. Thereafter, using the photoresist 13 as a mask, the conductive film 7a is dry-etched, thereby obtaining the gate electrode 7. In this example, the gate electrode 7 is formed so as to contact with the gate insulating film 6 at least on the body region 3 on the side surface of the trench 5.

Figure 2F:
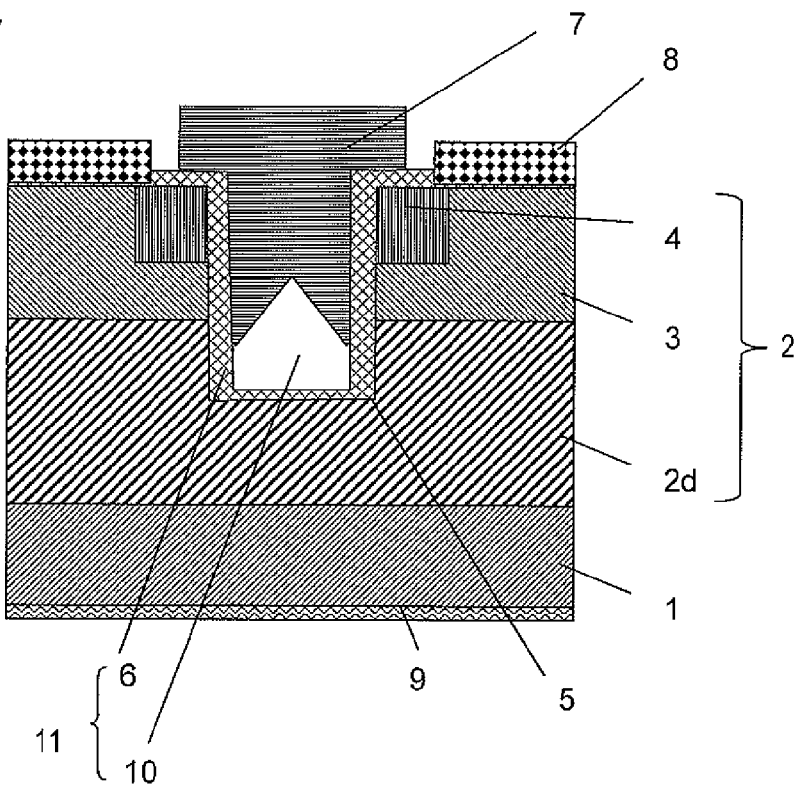
FIG. 2F A schematic cross-sectional view illustrating another manufacturing process step to fabricate the semiconductor device of the first embodiment.

Next, as shown in FIG. 2F, a source electrode 8 is formed so as to contact with the body region 3 and the source region 4. The source electrode 8 is arranged on the upper surface of the silicon carbide layer 2 to have contact with both the body region 3 and the source region 4. Specifically, first of all, an interlevel dielectric film (not shown) is deposited over the silicon carbide layer 2 and the gate electrode 7. Next, a hole is cut through the interlevel dielectric film to partially expose the source region 4 and the body region 3. Then, the hole is filled with a conductive film (which is a metal film such as a Ti film, for example) and an annealing process is performed if necessary. As a result, a source electrode 8 that makes ohmic contact with the source region 4 and the body region 3 can be obtained.

Meanwhile, a drain electrode 9 is formed on the back surface (which is opposite to the principal surface) of the substrate 1. In this manner, a MISFET with a trench gate structure is obtained.

Hereinafter, the correlation between the shape of the trench 5 and the sputtering direction will be described by way of examples.

Figure 3:
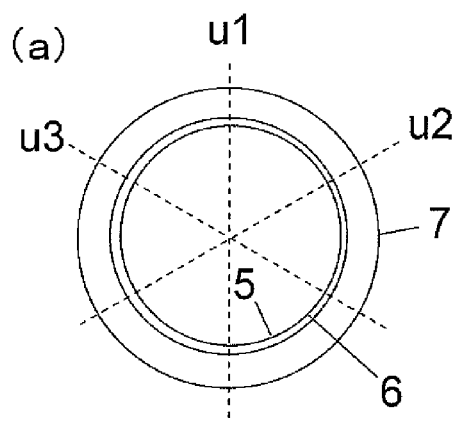
FIG. 3(a) to (c) are schematic plan views illustrating exemplary layouts for a trench in the semiconductor device of the first embodiment.
Figure 3:
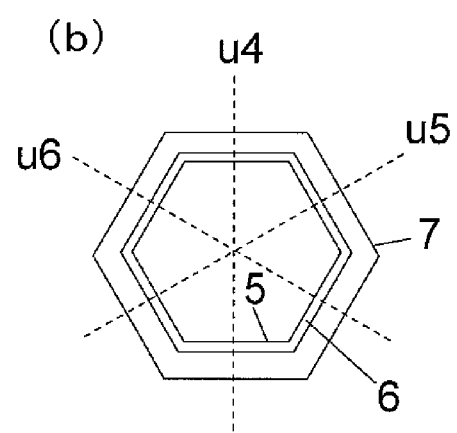
Figure 3:
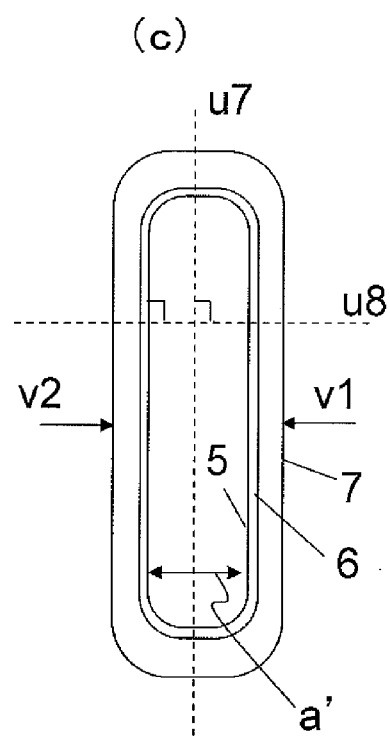

FIGS. 3(a) to 3(c) illustrate the planar shapes of trenches 5 with three different layouts. In each of these examples, the side surface of the trench 5 is supposed to be perpendicular to the principal surface of the substrate.

As shown in FIG. 3(a), in the case of a trench 5 that has a circular shape when viewed along a normal to the principal surface of the substrate 1, its side surface is perpendicular to the principal surface of the substrate and the maximum width of the trench 5 is always the same on any cross section, no matter in which direction the cross section is viewed (e.g., on each cross section as viewed in any of the directions u1 to u3). Likewise, even in the trench 5 that has a regular polygonal shape (e.g., a regular hexagonal shape in this example) when viewed from over the substrate 1 as shown in FIG. 3(b), its side surface is also perpendicular to the principal surface of the substrate and the maximum width of the trench 5 is always the same on any cross section, no matter in which direction the cross section is viewed (e.g., on each cross section as viewed in any of the directions u4 to u6). In these cases, the sputtering angle θ that satisfies the inequality described above b>a×tan θ>d (where a is the width of the trench, b is the depth of the trench 5, and d is the depth of the interface between the body region and the drift region) is always substantially the same on any of the cross sections indicated by the dotted lines in FIGS. 3(a) and 3(b) (i.e., on any of the cross sections as viewed in the directions u1 to u3 or in the directions u4 to u6). That is why by performing the sputtering process on the entire side surface of the trench 5 from a predetermined sputtering direction while rotating the wafer, a gap with any height can be left at the bottom of the trench 5.

On the other hand, in the case of a trench 5 with a striped shape as shown in FIG. 3(c), the width of the trench 5 as measured in the major axis direction u7 (i.e., the direction in which the stripe runs) is greater than (e.g., ten times or more as large as) the width a' of the trench 5 as measured in the minor axis direction u8 that intersects with the major axis direction u7 at right angles. That is why in such a situation, the sputtering angle θ is suitably obtained by substituting the width a' of the trench 5 as measured in the minor axis direction u8 into the inequality described above and it is recommended that the oblique sputtering be performed in two directions v1 and V2 that are parallel to the minor axis direction. Then, a gap with any height can be left at the bottom of the trench 5.

According to the method that has already been described with reference to FIG. 2, the trench 5 is formed to have a side surface that is perpendicular to the substrate 1. But the trench 5 may have a tapered shape. Also, although the corner portion is formed in the illustrated example by the side surface and bottom of the trench 5 that intersect with each other at right angles, the side surface and bottom do not have to cross each other at right angles if the trench 5 has a downwardly or upwardly tapered shape. Furthermore, the same effect can also be achieved even if the corner portion is somewhat rounded through an etching process or any other process. Even when the trench 5 has a tapered shape, a gap with any predetermined height can still be left at the bottom of the trench 5 by modifying the inequality b>a×tan θ>d with the taper angle considered geometrically and calculating the sputtering angle θ.

According to the method described above, the gate insulating film 6 and the gap 10 are arranged between the bottom of the trench 5 and the gate electrode 7 and together function as an insulating region (or insulating layer) 11. As a result, the thickness of the insulating region 11 on the bottom of the trench 5 can be increased to 400 nm or more, for example, and the intensity of the electric field applied to and around the bottom of the trench 5 can be reduced to 4 MV/cm or less. Meanwhile, the thickness of the insulating region 11 on a surface region of the body region 3 that is exposed on the side surface of the trench 5 (i.e., in the channel portion) is defined by the thickness of the gate insulating film 6 and may be 70 nm, for example.

By selectively leaving the gap 10 at the bottom of the trench 5 in this manner, the insulating region 11 can be thicker at the bottom of the trench 5 than on the side surface of the trench 5. For example, the insulating region 11 at the bottom of the trench 5 becomes at least three times as thick as, and can even be five times or more as thick as, the insulating region 11 on its side surface. On top of that, the thicknesses of the insulating region 11 on the side surface and bottom of the trench 5 can be controlled arbitrarily independently of each other. Consequently, the intensity of the electric field generated in the insulating region 11 at the bottom of the trench 5 can be reduced and the dielectric breakdown can be minimized without deteriorating the transistor performance.

In addition, since there is no need to form any thick thermal oxide film by oxidizing the silicon carbide at the bottom of the trench 5, stress will be hardly caused to the substrate 1 due to oxidation and introduction of defects into the silicon carbide layer 2 can be minimized. As a result, long-term reliability can be ensured more easily.

According to this embodiment, the trench 5 does not have to have the shape illustrated in the drawings. Optionally, the entire side surface of the trench 5 may have an upwardly tapered shape with a substantially constant tilt angle. Still alternatively, the trench may also have a depressed shape, of which the width (or the hole) is narrower around the middle than in the upper or lower portion.

The configuration and manufacturing process of the semiconductor device that have been described above are just an embodiment of the present invention. That is, to say, the present invention is in no way limited to that specific embodiment. For example, according to the present invention, the trench 5 may have any depth as long as the trench 5 reaches the drift region 2d and can define the insulating region 11 as intended at the bottom of the trench 5 and does not have to have the depth adopted in the embodiment described above. Likewise, the thickness and dopant concentration of the drift region 2 are also determined by the intended breakdown voltage and do not have to have the numerical values described above, either. Even though a thermal oxide film is formed as the gate insulating film 6 by thermally oxidizing silicon carbide in the manufacturing process described above, the same effect can also be achieved even if the gate insulating film 6 is formed by CVD process, for example, after the trench 5 has been formed.

In the foregoing description of embodiments, the semiconductor device described above is supposed to be an re-channel MISFET. However, a semiconductor device according to the present invention may also be a p-channel MISFET as well. In the p-channel MISFET, the conductivity type of the SiC substrate 1, the drift region 2d and the source region 4 becomes p-type and that of the body region 3 becomes n-type.

Also, although a 4H—SiC substrate is used as the substrate 1 in the embodiment described above, a SiC substrate, of which the principal surface is defined by any other crystallographic plane or which has any other poly-type, may also be used. Furthermore, when the 4H—SiC substrate is used, the silicon carbide layer 2 may be formed on its Si plane and the drain electrode 9 may be formed on its C-plane. Alternatively, the silicon carbide layer 2 and the drain electrode 9 may also be formed on its C and Si planes, respectively. Optionally, a semiconductor substrate other than a SiC substrate may be used as the substrate 1.

Furthermore, in the semiconductor device 100 of the embodiment described above, the silicon carbide layer 2 is supposed to have the body region 3, the source region 4 and the drift region 2d. However, the silicon carbide layer 2 may have other components, too. For example, another doped layer of the second conductivity type may be provided for a portion of the drift region 2d near the bottom of the trench 5 in order to reduce the overconcentration of the electric field.

The semiconductor device of any of the embodiments described above is a MISFET with an inversion channel structure. However, the present invention is also applicable to a MISFET, of which the channel layer has a different conductivity type from its body region, and the same effect as what has already been described can be achieved in that case, too.

Figure 4:
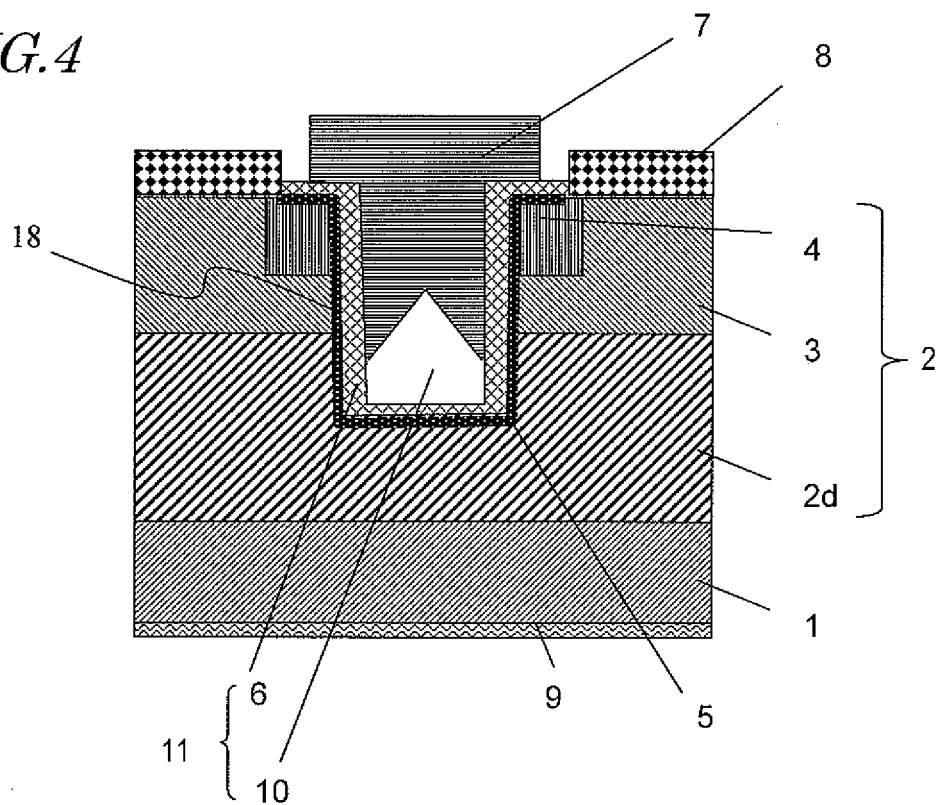
FIG. 4 A schematic cross-sectional view illustrating another semiconductor device according to the first embodiment of the present invention.
Figure 5:
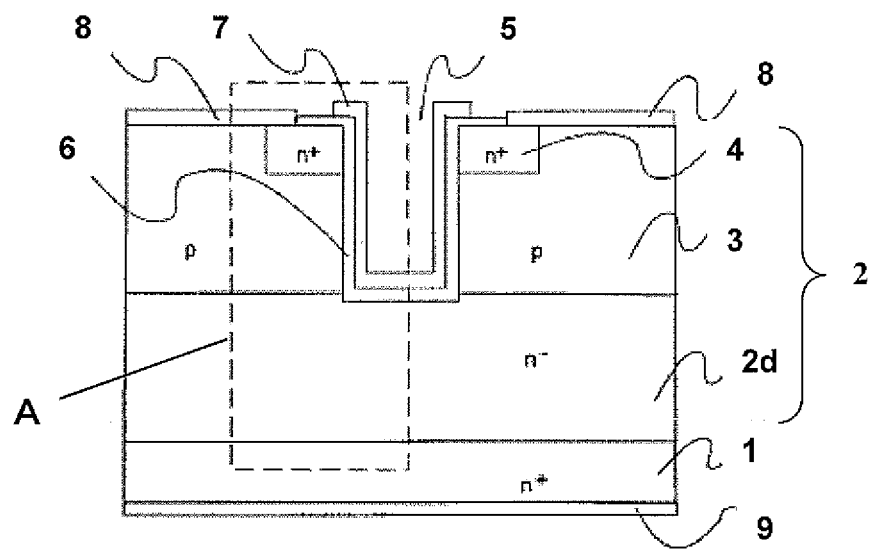
FIG. 5 A cross-sectional view schematically illustrating one unit cell of a known MISFET with a trench gate structure.
Figure 6:
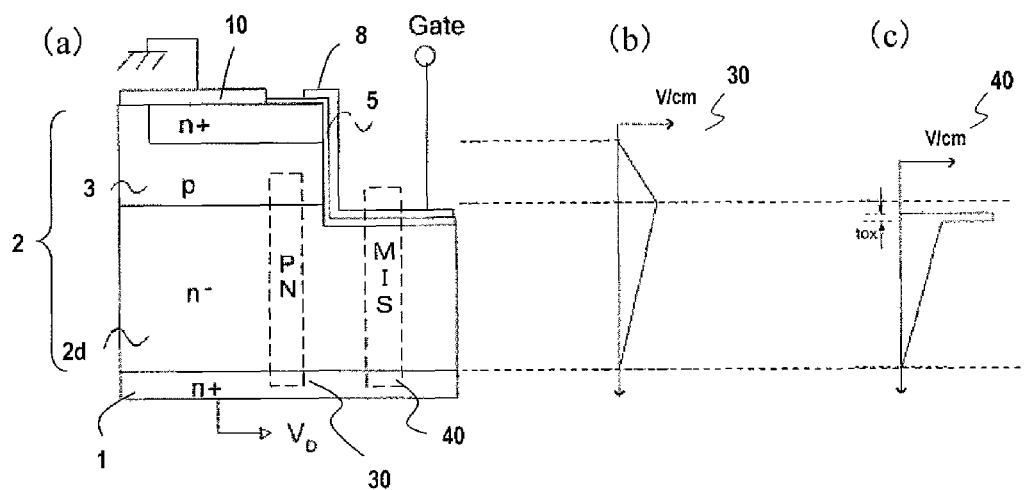
FIG. 6(a) is a cross-sectional view illustrating on a larger scale a dotted line portion A of the known MISFET shown in FIG. 5, and (b) and (c) show the distributions of electric field intensities of a PN junction portion 30 and a MIS structure portion 40, respectively, in the OFF state (i.e., when a drain voltage is applied).

FIG. 4 is a cross-sectional view illustrating such a MISFET, of which the channel layer has a different conductivity type from its body region. In FIG. 4, any component also shown in FIG. 1 and having substantially the same function as its counterpart is identified by the same reference numeral for the sake of simplicity and description thereof will be omitted herein.

In each unit cell of the semiconductor device shown in FIG. 4, a channel layer 18 of silicon carbide is arranged on the bottom and side surface of the trench 5. The channel layer 18 may be a silicon carbide layer of a first conductivity type, which has been grown epitaxially. The channel layer 18 of this embodiment is equivalent to the second semiconductor layer of the claimed invention.

The semiconductor device shown in FIG. 4 may be fabricated by almost the same method as the semiconductor device 100. In this case, however, before the gate insulating film 6 is formed, the channel layer 18 is epitaxially grown on the silicon carbide layer 2 and on the side surface and bottom of the trench 5. After that, the gate insulating film 6 is formed on the channel layer 18. As the gate insulating film 6, a thermal oxide film may be formed by oxidizing a surface portion of the channel layer 18.

Furthermore, the present invention does not have to be implemented as a vertical MISFET but may also be applied to any of various other kinds of semiconductor devices having a structure in which an electrode is arranged over a silicon carbide layer with an insulating film interposed between them. For example, although the MISFET described above is supposed to be fabricated using a silicon carbide substrate of the same conductivity type as the silicon carbide layer (drift region), an insulated gate bipolar transistor (IGBT) may also be fabricated using a silicon carbide substrate of a different conductivity type from the silicon carbide layer (drift region). In the case of an IGBT, the source electrode 8, drain electrode 9 and source region 4 described above are called an emitter electrode, a collector electrode and an emitter region (doped region), respectively.

Therefore, if the conductivity type of the drift region and emitter region is set to be n-type and that of the substrate and body region is set to be p-type in the semiconductor device 100 described above, an n-type IGBT can be obtained. Optionally, in that case, an n-type buffer layer may be arranged between the p-type substrate and the n-type drift layer. On the other hand, if the conductivity type of the drift region and emitter region is set to be p-type and that of the substrate and body region is set to be n-type, a p-type IGBT can be obtained. Optionally, in that case, a p-type buffer layer may be arranged between the n-type substrate and the p-type drift layer.

Also, although the embodiment described above is a semiconductor device that uses silicon carbide (SiC), the present invention is also applicable to a semiconductor device that uses any other wide bandgap semiconductor such as GaN, AlN or diamond, and the same effect can be achieved in that case, too.

INDUSTRIAL APPLICABILITY

The present invention is broadly applicable to a MISFET and other semiconductor devices that use a wide bandgap semiconductor and to various kinds of controllers and drivers that use such a semiconductor device. The semiconductor device of the present invention can be used effectively in a wide variety of power electronics products including a power device and intelligent power modules that uses the power device.

REFERENCE SIGNS LIST 2 substrate
2 silicon carbide layer
2d drift region
3 body region
4 source region
5 trench
6 gate insulating film
7 gate electrode
8 source electrode
9 drain electrode
10 gap
11 insulating region
13 photoresist
18 channel layer
100U unit cell
100 semiconductor device

The invention claimed is:
1. A semiconductor device comprising:
a substrate;
a semiconductor layer which is arranged on the principal surface of the substrate and which is made of a wide bandgap semiconductor;
a trench which is arranged in the semiconductor layer and which has a bottom and a side surface;
an insulating region which is arranged on the bottom and side surface of the trench; and
a conductive layer which is arranged in the trench and which is insulated from the semiconductor layer by the insulating region,
wherein the insulating region includes a gate insulating film that is arranged on the bottom and the side surface of the trench and a gap that is arranged between the gate insulating film and the conductive layer at the bottom of the trench, and
wherein the gate insulating film contacts with the conductive layer on a portion of the side surface of the trench but does not contact with the conductive layer at the bottom of the trench, and
wherein the thickness of the insulating region as measured from the bottom of the trench through the lower surface of the conductive layer is greater around the center of the trench than beside the side surface of the trench.

2. The semiconductor device of claim 1, wherein the semiconductor layer includes a drift region of a first conductivity type, a body region of a second conductivity type which is arranged on the drift region, and a doped region of the first conductivity type which is arranged on the body region, and
wherein the trench runs through the doped region and the body region and its bottom is located in the drift region, and
wherein a portion of the lower surface of the conductive layer, which is located beside the side surface of the trench, is deeper than an interface between the body region and the drift region.

3. The semiconductor device of claim 2, wherein a portion of the lower surface of the conductive layer, which is located around the center of the trench, is shallower than the interface between the body region and the drift region.

4. The semiconductor device of claim 1, wherein the gap is taller around the center of the trench than beside the side surface of the trench.

5. The semiconductor device of claim 1, wherein the bottom of the trench is deeper around the center of the trench than beside the side surface of the trench.

6. The semiconductor device of claim 1, wherein the gap is arranged at the bottom of the trench and at a corner portion that is defined by the bottom and the side surface of the trench.

7. The semiconductor device of claim 1, wherein the minimum value of the thickness of the insulating region as measured from the bottom of the trench through the lower surface of the conductive layer is five times or more as large as the thickness of the insulating region on the side surface of the trench.

8. The semiconductor device of claim 2, further comprising a second semiconductor layer of the first conductivity type, which is arranged between the body region that is exposed on the side surface of the trench and the gate insulating film.

9. The semiconductor device of claim 1, wherein the wide bandgap semiconductor is silicon carbide.

10. The semiconductor device of claim 9, wherein the gate insulating film is a silicon oxide film and wherein the gate insulating film is less thick at the bottom of the trench than on the side surface of the trench.

11. The semiconductor device of claim 1, wherein the electric field intensity is less than 4 MV/cm at the bottom of the trench.

12. A method for fabricating a semiconductor device, the method comprising the steps of:
(A) providing a substrate, on the principal surface of which a semiconductor layer of a wide bandgap semiconductor is formed;
(B) forming a trench, which has a bottom and a side surface, in the semiconductor layer;
(C) forming a gate insulating film on the bottom and side surface of the trench; and
(D) forming a conductive layer in the trench so that the conductive layer contacts with the gate insulating film on a portion of the side surface of the trench but does not contact with the gate insulating film at the bottom of the trench and that a gap is left between the conductive layer and the gate insulating film, thereby having an insulating region defined by the gap and the gate insulating film, wherein the thickness of the insulating region as measured from the bottom of the trench through the lower surface of the conductive layer is greater around the center of the trench than beside the side surface of the trench.

13. The method of claim 12, wherein in the step (A), the semiconductor layer includes a drift region of a first conductivity type, a body region of a second conductivity type which is arranged on the drift region, and a doped region of the first conductivity type which is arranged on the body region, and wherein in the step (B), the trench is formed so that the trench runs through the doped region and the body region to have its bottom located in the drift region, and wherein in the step (D), the conductive layer is formed so that a portion of the lower surface of the conductive layer, which is located beside the side surface of the trench, is deeper than an interface between the body region and the drift region.

14. The method of claim 12, wherein the gap is taller around the center of the trench than beside the side surface of the trench.

15. The method of claim 13, wherein the step (D) includes the step (D1) of depositing a material of the conductive layer on the side surface of the trench from a first direction which tilts with respect to a normal to the principal surface of the substrate.

16. The method of claim 15, wherein the step (D1) includes depositing the material of the conductive layer from the first direction while rotating the substrate within a plane that is parallel to the principal surface of the substrate, and wherein the angle θ defined between the first direction and the principal surface of the substrate is set so as to satisfy $b > a \times \tan\theta > d$ and $b - a \times \tan\theta > 350$ nm, where a is the width of the trench, b is the depth of the trench as measured from the surface of the semiconductor layer, and d is the depth of the interface between the body region and the drift region as measured from the surface of the semiconductor layer.

17. The method of claim 15, wherein the step (D1) includes depositing the material of the conductive layer from at least the first direction and a second direction that is opposed to the first direction, and wherein the angle θ defined between the first direction and the principal surface of the substrate is set so as to satisfy $b > a' \times \tan\theta > d$ and $b - a' \times \tan\theta > 350$ nm, where a' is the width of the trench as measured on a cross section including the first direction, b is the depth of the trench as measured from the surface of the semiconductor layer, and d is the depth of the interface between the body region and the drift region as measured from the surface of the semiconductor layer.

* * * * *